United States Patent [19]
Saia et al.

[11] Patent Number: 5,370,972
[45] Date of Patent: Dec. 6, 1994

[54] AMORPHOUS SILICON PHOTODIODE WITH SLOPED SIDEWALLS AND METHOD OF FABRICATION

[75] Inventors: Richard J. Saia; Robert F. Kwasnick, both of Schenectady; Brian W. Giambattista, Scotia, all of N.Y.

[73] Assignee: General Electric Company, Schenectady, N.Y.

[21] Appl. No.: 949,954

[22] Filed: Sep. 24, 1992

Related U.S. Application Data

[62] Division of Ser. No. 783,747, Oct. 28, 1991.

[51] Int. Cl.$^5$ .............................................. G03C 5/00
[52] U.S. Cl. ............................. 430/311; 430/313; 430/314; 257/52; 156/643; 156/646
[58] Field of Search ............ 430/311, 313, 314; 257/52; 156/612, 613, 625

[56] References Cited

U.S. PATENT DOCUMENTS

| | | | |
|---|---|---|---|
| 4,933,209 | 6/1990 | Anthony et al. | 430/314 |
| 5,100,505 | 3/1992 | Cathey, Jr. | 156/643 |

OTHER PUBLICATIONS

"Dry Etching of Tapered Contact Holes Using Multilayer Resist," R. J. Saia and B. Gorowitz, vol. 132, No. 8, Journal of the Electrochemical Society, pp. 1954–1957, Aug. 1985.

Primary Examiner—Steve Rosasco
Attorney, Agent, or Firm—Donald S. Ingraham; Marvin Snyder

[57] ABSTRACT

Solid state photodetectors having amorphous silicon photodiode bodies with sloped sidewalls allowing for deposition of high integrity conformal layers thereover are produced by etching the amorphous silicon in a mostly anisotropic etchant in a reactive ion etcher in which the pressure of the etchant is controlled. A photoresist mask having sloped sidewalls is formed over the amorphous silicon to be etched and the pressure of the etchant is selected to produce the desired slope of the sidewall in the photodetector body; at lower pressures a smaller slope is produced in the silicon and at higher pressures a steeper slope is produced in the silicon.

14 Claims, 5 Drawing Sheets

AMORPHOUS SILICON PHOTODIODE WITH SLOPED SIDEWALLS AND METHOD OF FABRICATION

This application is a division of application Ser. No. 07/783,747, filed Oct. 28, 1991.

FIELD OF THE INVENTION

This invention relates to the field of photodetectors and in particular to low charge leakage photodiodes comprised of amorphous silicon semiconductor material.

BACKGROUND OF THE INVENTION

Photodetectors are commonly used in a number of solid state imaging devices, such as facsimile machines and solid state radiation detectors employed in medical diagnostic procedures, in which it is necessary to convert an optical image into corresponding electrical signals. For example, in a radiation imager the incident radiation strikes a scintillator material that generates light photons when the incident radiation is absorbed. Photodetectors in turn generate electrical signals when struck by the light photons, and the electrical signals are used to operate an imaging system or are further processed or analyzed.

Solid state photodiodes used in radiation imaging systems are typically arranged in either a one-dimensional or a two-dimensional array. The individual photodiodes are electrically coupled to a data electrode on or off of the substrate so that the charge developed in each diode in response to incident light can be sampled. In a typical photodiode a layer of photosensitive material is disposed between a common electrode and an electrical contact pad that is coupled to the data electrode. The change in charge in the photodiode resulting from exposure of the photosensitive material to the incident light photons creates an electrically measurable signal which is used in the imaging systems. Amorphous silicon is advantageously used as the photosensitive material.

The resolution of the imaging device is a function of the size and performance of each photodetector. To improve resolution, such as by presenting more image lines per inch of visual display, a greater number of photodiodes are required per unit area of the photodetector array. Particularly in a large array, such as one having an area about 16 square inches or larger, imager readout is degraded by an induced capacitance between the common electrode and the data lines to which the photodiode contact pads are coupled. Imager performance is also degraded if individual photodiodes have high charge leakage or "dark current", i.e. an electrical signal produced even when the photodiode is not exposed to light photons. It is important that the photodetector array be fabricated so as to allow photodiode charge to be accurately read within the allowed data sampling times of the system; it is thus desirable to minimize the capacitance between the common electrode and the data sampling lines and to provide a photodiode structure that reduces the undesired charge leakage. A critical step in the fabrication of the array that affects both of these concerns is the patterning of the photosensitive material into the individual structure associated with each photodetector, i.e., the photodiode body.

It is known to be difficult to form photodiodes from amorphous silicon, a desirable and commonly used photosensitive material, using traditional etching techniques. These difficulties manifest themselves both in problems related to consistent formation of individual photodiode bodies having a desired structure and in forming a large area array comprising substantially uniformly shaped photodiodes across the array. For example, it is difficult to reproducibly control the sidewall profile of the silicon photodiode body when using typical amorphous silicon etching techniques, such as use of a barrel etcher with an etchant comprising $CF_4$ and $O_3$. The sidewalls produced in silicon photodiode bodies etched by such methods frequently have a vertical or reentrant profile that can cause imager device defects due to poor step coverage of subsequently deposited layers. Additionally, because the barrel etcher provides a purely isotropic etch, there is poor dimensional control when etching a large number of photodiode bodies in an array due to the so-called "bulls-eye" effect in which structures at the edges of the array are etched more rapidly than structures towards the center of the array. Such a situation results in either the structures on the edges being overetched (i.e., made smaller than desired) or, if the etch time is reduced, the structures near the center of the array not being etched sufficiently.

Known reactive ion etching techniques also do not provide a reliable method for reproducibly and controllably etching silicon to create the structure desired in a photodiode body. The "resist erosion method" allows replication of the slope of a photoresist layer in underlying layers of certain materials to be etched, such as silicon dioxide, and this method is commonly used for fabricating via holes in semiconductor fabrication. See R. Saia and B. Gorowitz, "Dry Etching of Tapered Contact Holes Using Multilayer Resist", 132 *J. Electrochem. Soc.*, 1954–57 (Aug. 1985). Such methods, however, are not readily applied to etching amorphous silicon because the standard methods to match the resist and vertical silicon etch rates cause large increases in the lateral etch rate of the silicon, resulting in problems similar to those described above with respect to using the barrel plasma etcher. For example, if the vertical to lateral etch ratio of both the resist and the underlying layer being etched is high and equal for both materials, then the shape of the sidewall in the resist will be replicated in the etched layer. The steepness of the slope of the underlying material can be modified by changing the ratio of the vertical etch rates of both layers. In etching materials such as silicon dioxide, this change in etch ratios is typically accomplished by adding oxygen to a fluorinated gas ($CHF_3/O_2$), or by altering the gas ratio to increase the amount of atomic fluorine in the plasma ($NF_3/Ar$), both of which raise the vertical etch rate of the photoresist with respect to silicon dioxide. These standard methods do not, however, produce acceptable results when etching amorphous silicon because the addition of the oxygen or alteration of the gas ratios also result in large increases in the lateral etch rate of the silicon, causing problems similar to those discussed above with respect to the use of barrel etching techniques.

It is thus desirable to have a method of etching amorphous silicon that allows the fabrication of an array of a large number of uniformly-shaped silicon photodiode bodies which have substantially uniformly sloped, smooth sidewalls allowing for improved step coverage of subsequently deposited layers and low charge leakage from the photodiode body. Additionally, such a silicon etch process desirably is selective to the underlying material layers which will be exposed to the etchant, such as silicon nitride or silicon oxide, so that such layers form an effective etch stop. The etch process also should be slightly isotropic in nature so as not to leave silicon spacers on the sidewalls of the nonplanarized underlying topography in the array; such residual silicon remnants or "stringers" could provide a path for electrical shorts which would adversely affect imager performance.

It is thus an object of this invention to provide a method of reproducibly and controllably patterning silicon to allow the formation of sidewall surfaces having a slope that is substantially uniform and the degree of which can be selected. A further object of this invention is to provide an effective and readily performed method of patterning amorphous silicon to form a large number of substantially uniformly shaped photodiode bodies in a photodetector array having the necessary characteristics to provide electrical signals for high resolution images of the detected light. It is yet a further object of this invention to provide a photodetector structure having a photodiode body conducive to improved step coverage of subsequently deposited layers.

SUMMARY OF THE INVENTION

In accordance with this invention, a solid state photodetector comprising a photodiode body has sidewalls with a substantially uniform, selected slope that is conducive to the deposition of a high integrity conformal layer thereover. The photosensitive material forming the photodiode body is advantageously amorphous silicon and the slope of the sidewalls is selected to be between about 45° and 80° to a/low for good step coverage of subsequently deposited layers. Such uniformly-shaped photodiodes are advantageously disposed in an array to provide for the generation of electrical signals in a high resolution imaging system.

Further, in accordance with this invention, a method of forming sloped sidewalls in silicon comprises the steps of controllably exposing the silicon underlying a patterned photoresist layer to an etchant in a reactive ion etcher. The step of controllably exposing the silicon to the etchant comprises selecting and maintaining the pressure of the etchant to produce the selected slope in the sidewall. The slope of the sidewall of the etched silicon corresponds to the slope of the sidewall of the photoresist mask but varies in dependence on the selected pressure of the etchant. The etchant is mostly anisotropic in that it results in a vertical to horizontal etch rate in a range between less than about 10 to 1 and about 7 to 1. As the pressure of the etchant is lowered, sidewalls are produced that have a smaller slope angle, with etchant pressures typically being between 20 and 100 mtorr resulting in sidewall angles between about 45° and 80°, respectively.

Such a method is readily used for the fabrication of a large number of substantially uniformly shaped photodiodes to form an array. Fabrication of such an array comprises the steps of forming an electrically conductive bottom contact pad for each photodiode; depositing a layer of photosensitive material over the contact pads; patterning the photosensitive material to form photodiode bodies substantially aligned with respective ones of the contact pads and having sloped sidewalls with a selected, substantially uniform slope; and forming a common electrode over the array with the electrode being in electrical contact with the photosensitive material overlying the bottom contact pad and electrically insulated from remaining portions of the array. The photosensitive material is advantageously amorphous silicon and the patterning of the photosensitive material comprises controllably exposing the silicon to a dry etchant in a reactive ion etcher, the pressure of the etchant being chosen to selectively control the slope of the sidewall formed in the silicon.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE PREFERRED EMBODIMENT

Figure 1:
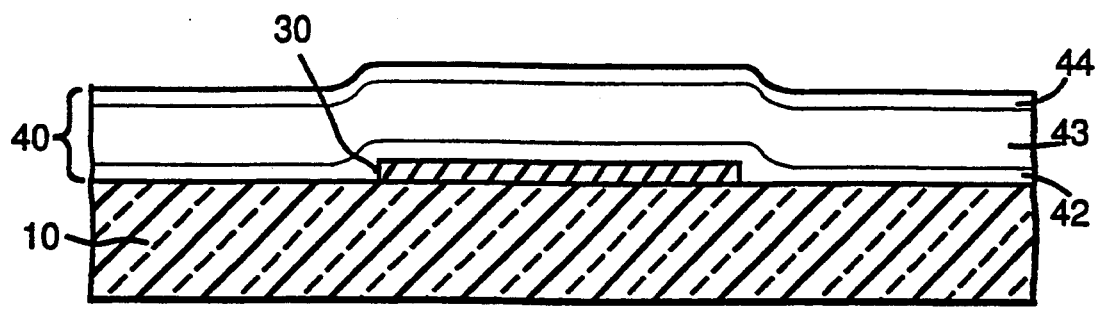
FIGS. 1-5 are cross-sectional views illustrating successive steps in the fabrication of a solid state photodetector in accordance with the present invention.

FIG. 1 is a cross sectional view of a portion of a substrate 10 on which an array of solid state photodiodes is to be fabricated. A plurality of electrically conductive bottom contact pads 30 are formed on substrate 10 by conventional metal deposition and patterning means in positions where it is desired to fabricate the photodiodes in the array. The bottom contact pads are electrically coupled to data lines (not shown) so that charge developed in each photodiode as a result of exposure to light can be read out. Dependent upon the fabrication process for the particular photodiode array and mechanism of reading out the charge in the photodiodes, additional dielectric layers (not shown) may underlie, abut, or partially overlie contact pads 30, but the presence or lack of such layers does not materially affect or alter the shaping of the photosensitive material in the photodiode in accordance with the present invention.

In a typical device, substrate 10 comprises glass and bottom contact pads 30 comprise a metal that exhibits desirable electrical characteristics, including low resistivity, and desirable material characteristics, such as adherence to adjoining layers in the assembled device, laser weldability, and the like. For example, the contact pads may comprise molybdenum. The thickness of contact pads 30 is typically between about 0.1 μm and 1.0 μm.

A layer 40 of a photosensitive material is then deposited by chemical vapor deposition or other known techniques over the array structure then existing on the substrate. The photosensitive material advantageously comprises amorphous silicon, with a first sublayer 42 further comprising a dopant to provide the necessary electrically conductive contact between photosensitive material layer 40 and the underlying contact pad 30; a second sublayer 43 comprising substantially undoped hydrogenated intrinsic amorphous silicon, and a third sublayer 44 further comprising a dopant to provide the necessary electrically conductive contact between photosensitive material layer 40 and a subsequently deposited electrode layer. By way of example and not limitation, in a typical photodiode arrangement first sublayer 42 is advantageously doped to be n+ material and third sublayer 44 is doped to be p+ material. Photosensitive material layer 40 typically has a thickness between about 0.5 μm and 2.0 μm. although such a layer could be even thicker if necessary for the particular use of the array.

Figure 2:
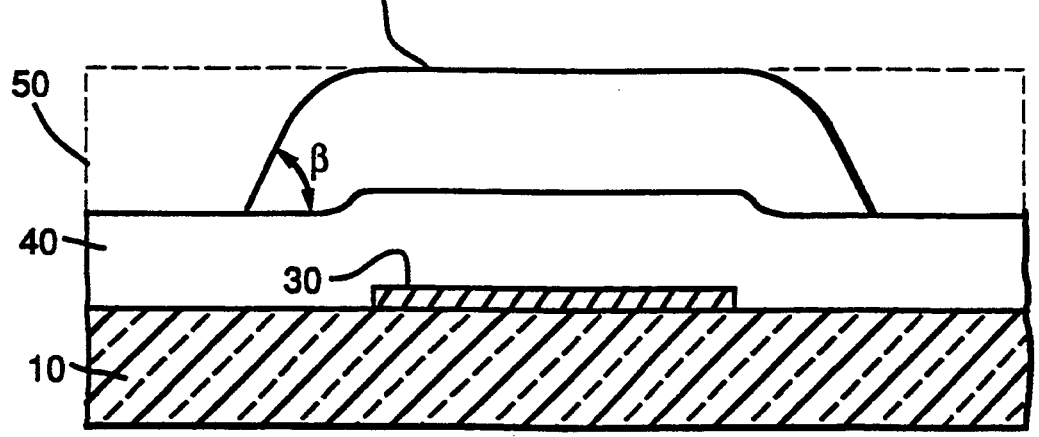

In accordance with this invention, photosensitive material layer 40 is patterned by first depositing a layer of photoresist 50 (subsequently removed portions of which are shown in phantom) over photosensitive material layer 40 and processing the photoresist to form a mask 52, as illustrated in FIG. 2. As used herein, "processing" refers to any known means for shaping a photoresist layer to form a mask compatible for the process to be used to etch an underlying layer. Mask 52 is disposed substantially in alignment with contact pad 30, i.e., it is disposed so that its geometric shape in the plane perpendicular to the cross-section shown in FIG. 2 is substantially the same as the geometric shape of the contact pad and the centers of these geometric shapes are positioned in substantial vertical alignment with one another. Known techniques, such as those described in the article of Saia et al. cited above, can be used to shape the mask so that its sidewalls have a slope $\beta$ (FIG. 2) within a predetermined range, for example between about 45° and 80° degrees.

Figure 3:
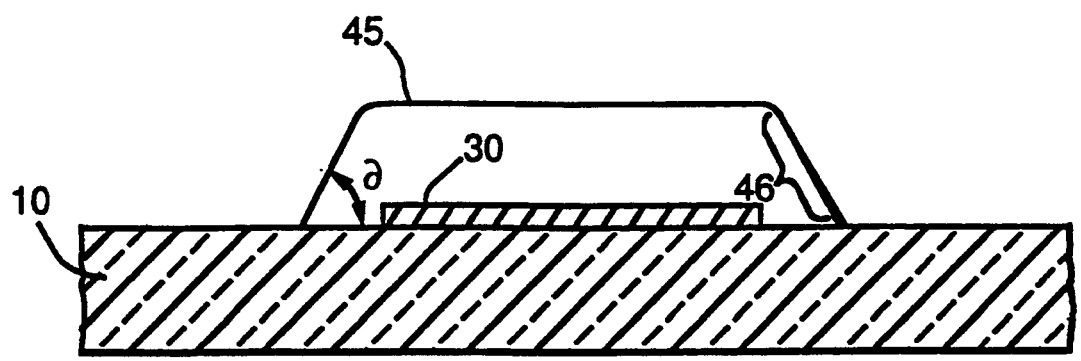

Next, photosensitive material layer 40 is etched to form a photodiode body 45 (in an array, one photodiode body is typically formed over and in substantial alignment with each contact pad 30) as illustrated in FIG. 3. The etching is accomplished in a reactive ion etcher using a mostly anisotropic dry etchant comprising a mixture of an isotropic etchant and a primarily anisotropic etchant. As is generally known in the art, "primarily anisotropic" refers to etchants which provide a vertical to horizontal etch ratio of greater than about 10:1. As used herein, "mostly anisotropic" refers to an etchant resulting in vertical to horizontal etch ratios in the range of about 7:1 to about 10:1, that is, the etchant is very slightly isotropic. It is desirable to use a mostly anisotropic etchant in order to ensure that silicon "stringers" or "spacers" do not remain on non-planar areas of the array, such as around topographic features like data lines. The etchant advantageously comprises a mixture of sulfur hexafluoride ($SF_6$), an isotropic etchant, and hydrochloric acid (HCl), a primarily anisotropic etchant. The ratio of hydrochloric acid to sulfur hexafluoride in the mixture is between about 1:1 and 2:1.

Figure 6:
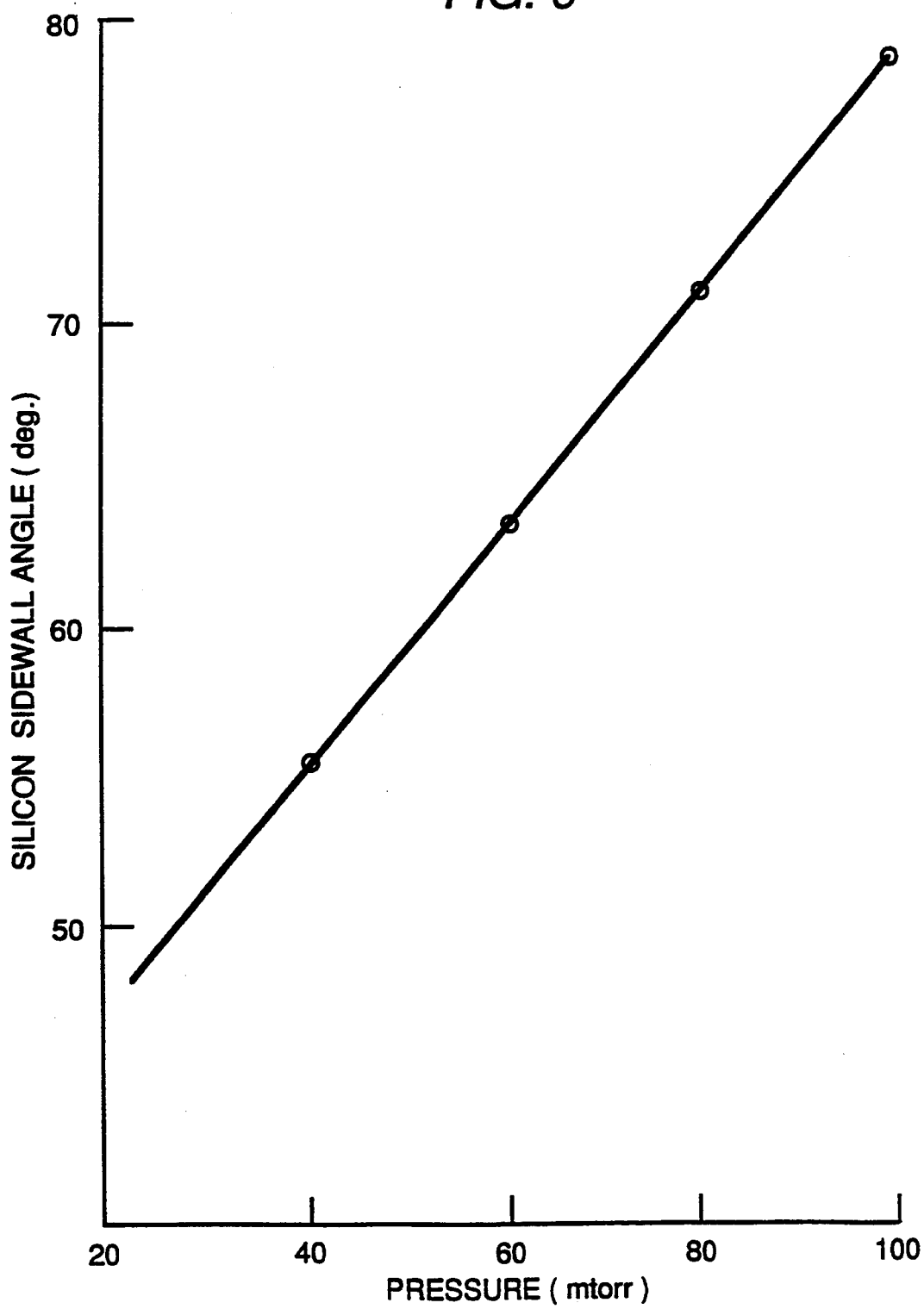
FIG. 6 is a graphic representation of the relationship between etchant pressure and resulting sidewall slope in the process of the present invention.
Figure 7:
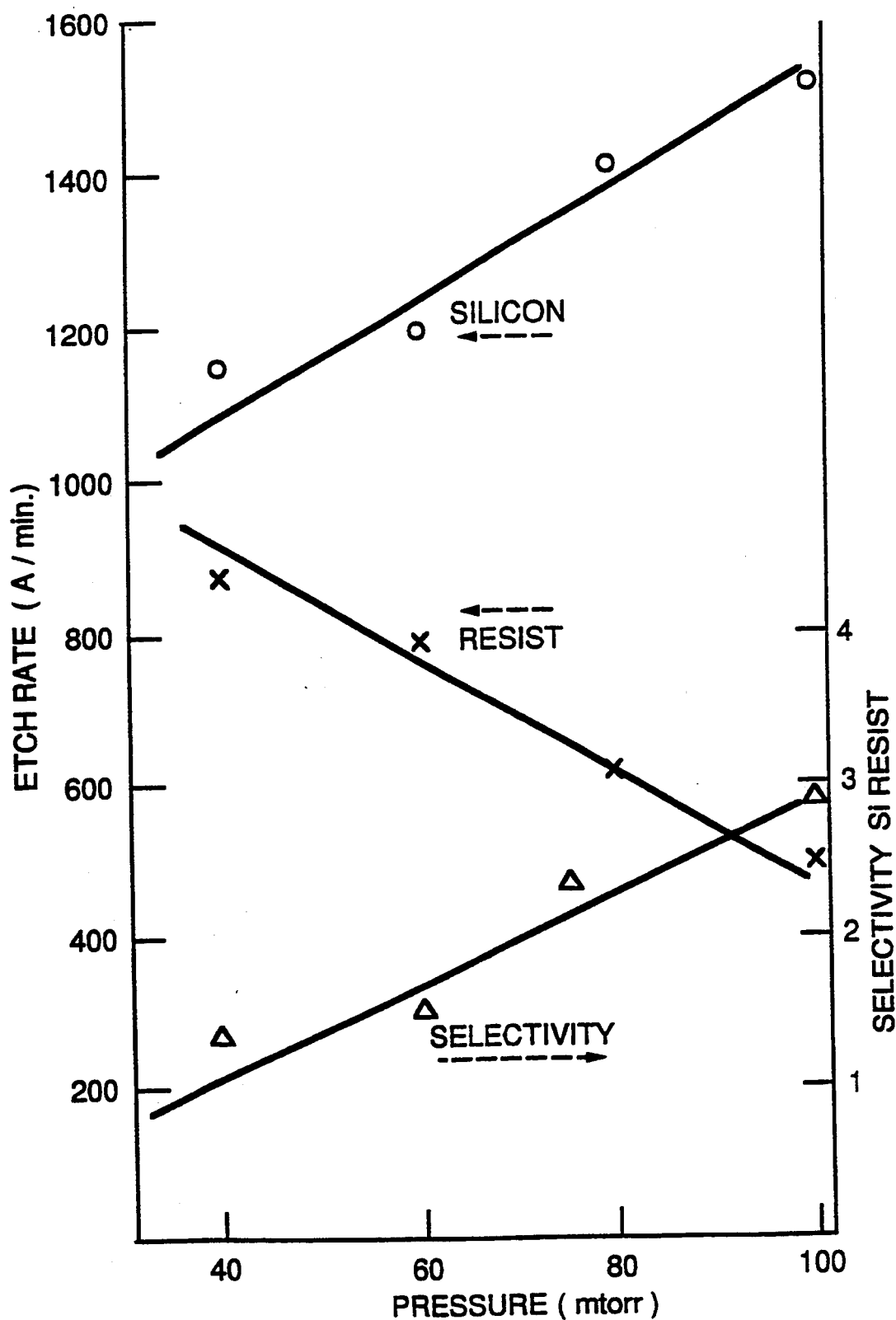
FIG. 7 is a graphic representation of the relationship between etch rates of silicon and photoresist as a function of etchant pressure in accordance with the method of the present invention.

In accordance with the invention, the slope of a sidewall 46 of photodiode body 45 can be selected by controllably exposing photosensitive layer 40 to the etchant at a selected pressure. The slope of the sidewall varies proportionally to the pressure of the etchant so that the angle $\partial$ (FIG. 3) of the slope with respect to the horizontal plane is smaller at lower pressures and larger at higher pressures, i.e., the sidewalls have a steeper slope when a higher pressure is used. For example, an amorphous silicon layer etched in accordance with this invention in a reactive ion etcher having an anodized Al cathode cover and using a mixture of 20 sccm (standard cubic centimeters per minute) of $SF_6$ and 30 sccm of HCl at 0.25 Watts/cm² (RF power in the etcher) at a pressure of 100 mtorr results in a silicon etch rate of about 1509 Å/min, and a resist etch rate of about 502 Å/min. This process also has a relatively low etch rate (174 Å/min) for $SiO_2$, a typical material used in dielectric or passivation layers that might be present on the substrate around the contact pads. Using a photoresist mask having approximately 45° to 50° sidewalls, such etch rates result in a slope of about 80° in the photodiode body sidewall. With this particular etchant, it has been observed that the resultant slope of the photodiode body sidewall is directly proportional with the pressure of the etchant, i.e., the slope varies substantially linearly between 45° and 80° when the pressure of the etchant is in the range of between about 20 mtorr to about 100 mtorr respectively, as indicated in FIG. 6. The variation of silicon and photoresist etch rates as a function of etchant pressure is illustrated in FIG. 7, along with the "selectivity," or the ratio of the silicon to photoresist etch rates.

Thus, in accordance with this invention the slope of the sidewalls of the photodiode corresponds to the slope of the photoresist mask in that the photodiode body sidewall will slant in the same direction as the photoresist mask sidewall and in that the angle of the mask sidewalls will affect the slope of the sidewall of the photodiode body, dependent on the selected pressure of the etchant. The resulting sidewalls of the photodiode body have slopes that are substantially uniform along their length and present a smoothly sloped surface which is conducive to deposition of high integrity conformal layers over the sidewalls, that is, the layers are readily deposited on the shaped sidewalls and form structures that do not have significant internal stresses or voids that affect either their structural integrity along the length of the sidewall or any desired electrical or optical characteristics, such as dielectric properties (including charge leakage from the device) or optical transparency. If there are additional dielectric or passivation layers underlying or abutting contact pads 30, this etching step desirably will not significantly etch such passivation materials. At the completion of the reactive ion etching step, any remaining portions of photoresist mask 52 are stripped away, and the structure at the end of the patterning of the photodiode body is illustrated in FIG. 3. It is to be noted that the sidewalls of the photodiode body in accordance with this invention may extend beyond the edges of contact pad 30 as shown in FIG. 3, or alternatively may extend only to the upper surface of contact pad 30.

Particularly when the photodiode body has been etched at pressures lower than 100 mtorr, it is advantageous to next conduct a post etch treatment to remove a small layer from the surface of the photodiode body in order to reduce edge leakage from the assembled device. Especially at the lower pressures for the reactive ion etching process in accordance with this invention, the intense ion bombardment on the more sloped and exposed silicon sidewall increases the possibility that the sidewall surface will be prone to leakage. Thus a second dry etch step that decreases the ion bombardment intensity, such as one conducted at a relatively high pressure, e.g. 100 mtorr, can be performed without breaking vacuum in the reactive ion etcher. Alternatively, a wet etch step can be used. In either case, the post-etch treatment reduces edge leakage from the photodiode body, which is an important parameter in the performance of the photodetector array.

Figure 4:
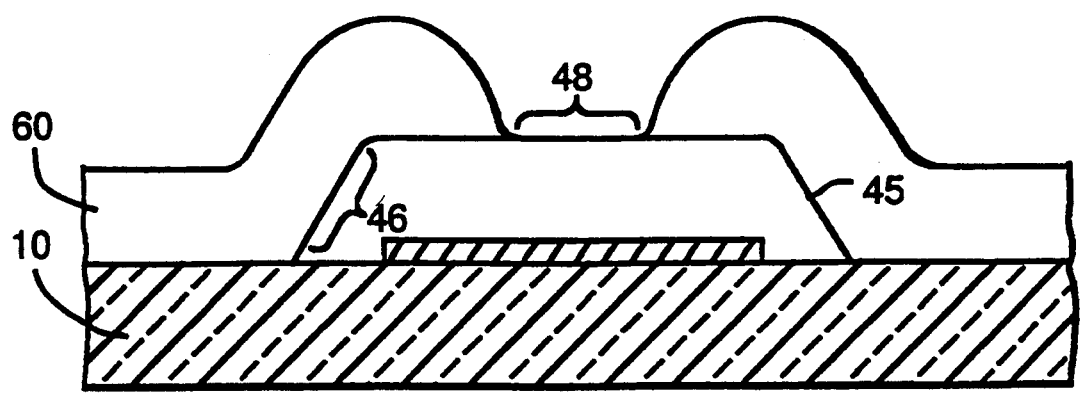

Next, a photodetector dielectric layer 60 is conformingly deposited over the array and patterned to expose an electrode contact area 48 on the upper surface of photodiode body 45, as shown in FIG. 4. Photodetector dielectric layer 60 advantageously comprises an organic dielectric material, such as a polyimide, or an inorganic dielectric material, such as silicon dioxide or silicon nitride. Once the amorphous silicon has been deposited, subsequent processing steps in the fabrication of the array should be performed at or below 250° C. to avoid damaging the silicon. The photodiode body sloped sidewalls formed in accordance with this invention allow use of low temperature (about 250° C. or less) deposition techniques, such as plasma enhanced chemical vapor deposition with tetraethoxysilicate (TEOS) as the carrier for the silicon, to form high integrity conformal dielectric layers of silicon dioxide. Dielectric layer 60 preferably is substantially transparent. The thickness of dielectric layer 60 is selected to be compatible with the particular electrical design of the array and to maintain a high integrity layer over the sidewall, i.e. one that does not have significant voids, pinholes, cracks, or stress areas that may cause peeling or other degradation of the layer. In an array used as a part of a radiation imager, typical thicknesses for this layer may range between about 0.51 µm and 2.5 µm, which is sufficient to provide high structural integrity and minimize the induced capacitance between electrically conductive components on either side of the dielectric layer. Photodetector dielectric layer 60 provides good step coverage over photodiode body 45 as it forms a high integrity, conformal layer over photodiode sidewalls 46. At the completion of this step, the device appears as illustrated in FIG. 4.

Figure 5:
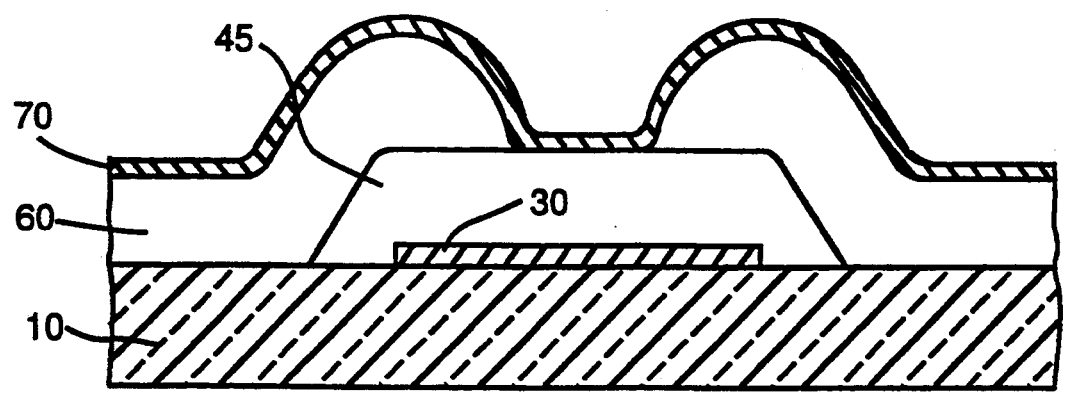

Fabrication of the structure of the photodetector array is completed by depositing a substantially transparent electrode layer over the array by vapor deposition or alternative known techniques to form a common electrode 70, as shown in FIG. 5. Common electrode 70 overlies photodetector dielectric layer 60 and photodiode body electrode contact area 48 so that it is in electrical contact with the amorphous silicon photodiode body. Common electrode 70 advantageously comprises indium tin oxide deposited to a thickness of between about 50 nm and 300 nm. The completed photodiode is illustrated in FIG. 5.

Typically, the illustrated photodiode is only one of many such photodiodes in the photodetector array, and all of the photodiodes on the substrate are simultaneously fabricated.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of forming sloped sidewalls in silicon layers comprising:
   patterning a photoresist layer overlying a silicon layer to be etched, said patterning further comprising shaping the sidewalls of said photoresist to have a predetermined slope; and
   controllably exposing said silicon layer and said photoresist layer in a reactive ion etcher to an etchant at a predetermined pressure;
   the step of controllably exposing said silicon layer further comprising the step of selecting said predetermined pressure of said etchant in said reactive ion etcher to produce a sidewall in said silicon layer having a slope corresponding to the slope of the sidewall of said photoresist layer and varying in dependence on the selected pressure of said etchant.

2. The method of claim 7 wherein said etchant comprises a mixture of a primarily anisotropic etchant and an isotropic etchant.

3. The method of claim 2 wherein said primarily anisotropic etchant comprises hydrochloric acid and said isotropic etchant comprises sulfur hexafluoride.

4. The method of claim 3 wherein the ratio of hydrochloric acid to sulfur hexafluoride in said etchant mixture is about 1:1 to 2:1.

5. The method of claim 1 wherein the the range of selected pressures of said etchant is between about 20 and 100 mtorr and the range of said slope of said sidewalls is between about 45° and 80°.

6. The method of claim 5 wherein said slope of said sidewalls is directly proportional to said selected pressure of said etchant.

7. The method of claim 6 further comprising the step of applying a post etch treatment to said silicon sidewalls, said post-etch treatment reducing edge leakage from said sloped silicon sidewalls.

8. A method of forming a solid state photodetector comprising the steps of:
   forming an electrically conductive bottom contact pad over a substrate;
   depositing a layer of photosensitive material over and in electrical contact with said contact pad;
   patterning said photosensitive material to form a photodiode body substantially aligned with said contact pad, said photodiode body having a first surface adjoining said contact pad and a second surface opposite said first surface, and having sidewalls extending from said second surface towards said first surface, said sidewalls having a selected, substantially uniform slope; and
   forming a common electrode in electrical contact with at least a portion of said photodiode body second surface;
   the step of patterning said photosensitive material further comprising the steps of depositing a photoresist layer over said photosensitive material; processing said photoresist layer to form a mask for formation of said photodiode body, the sidewalls of said mask having a slope within a predetermined range; and etching said photosensitive material with a dry mostly anisortopic etchant in a reactive ion etcher; the step of etching said photosensitive material further comprising selectively controlling the pressure of said etchant within a predetermined range to vary the slope of said photodiode body sidewalls, said mostly anisotropic etchant being selected such that the slope of the photodiode body sidewall increases with an increase of the predetermined etchant pressure.

9. The method of claim 8 wherein said mostly anisotropic etchant comprises a mixture of a primarily anisotropic etchant and an isotropic etchant.

10. The method of claim 9 wherein said primarily anisotropic etchant comprises hydrochloric acid and said isotropic etchant comprises sulfur hexafluoride.

11. The method of claim 8 wherein the step of forming a common electrode further comprises the steps of:

depositing a high integrity conformal dielectric layer over said photodiode body;

removing said conformal dielectric layer from at least a portion of said second surface of said photodiode body; and depositing an electrically conductive common electrode layer over said photodiode body and said conformal dielectric layer, said electrode layer being disposed over and in electrical contact with said second surface of said photodiode body.

12. The method of claim 8 further comprising the step of applying a post-etch treatment etching to reduce edge leakage from said photodiode body.

13. The method of claim 8 wherein said photosensitive material comprises silicon.

14. The method of claim 8 wherein said predetermined range of pressure of said etchant is between about 20 mtorr and 100 mtorr.

* * * * *